(12) United States Patent
Terakawa et al.

(10) Patent No.: US 8,043,885 B2
(45) Date of Patent: Oct. 25, 2011

(54) METHOD OF MANUFACTURING SEMICONDUCTOR FILM AND METHOD OF MANUFACTURING PHOTOVOLTAIC ELEMENT

(75) Inventors: Akira Terakawa, Nara (JP); Toshio Asaumi, Kobe (JP)

(73) Assignee: Sanyo Electric Co., Ltd., Osaka (JP)

(*) Notice: Subject to any disclaimer, the term of this patent is extended or adjusted under 35 U.S.C. 154(b) by 609 days.

(21) Appl. No.: 12/105,469

(22) Filed: Apr. 18, 2008

(65) Prior Publication Data

US 2008/0261347 A1 Oct. 23, 2008

(30) Foreign Application Priority Data

Apr. 20, 2007 (JP) ................. 2007-112333

(51) Int. Cl.
*H01L 21/205* (2006.01)
(52) U.S. Cl. ....... 438/96; 438/482; 427/74; 427/255.27; 257/E21.297
(58) Field of Classification Search ............. 427/74, 427/255.27, 255.393; 438/96, 482; 257/E21.297
See application file for complete search history.

(56) References Cited

U.S. PATENT DOCUMENTS

| | | | | |
|---|---|---|---|---|
| 4,409,424 A * | 10/1983 | Devaud | ........... | 136/258 |
| 6,124,186 A * | 9/2000 | Molenbroek et al. | ......... | 438/482 |
| 6,124,545 A * | 9/2000 | Bauer et al. | .................... | 136/255 |
| 6,399,429 B1 | 6/2002 | Yamoto et al. | | |
| 6,500,256 B2 * | 12/2002 | Yamoto et al. | ................... | 117/89 |
| 6,709,512 B2 * | 3/2004 | Yamoto et al. | ............ | 427/255.27 |
| 7,122,736 B2 * | 10/2006 | Wang et al. | ...................... | 427/74 |
| 7,807,495 B2 * | 10/2010 | Terakawa et al. | ................ | 438/96 |
| 2003/0221718 A1 | 12/2003 | Kubo et al. | | |
| 2005/0132961 A1 | 6/2005 | Saito | | |
| 2006/0009017 A1 * | 1/2006 | Sembommatsu et al. | ..... | 438/488 |
| 2008/0261348 A1 * | 10/2008 | Terakawa et al. | ................ | 438/96 |

FOREIGN PATENT DOCUMENTS

| | | |
|---|---|---|
| JP | 8-250438 | 9/1996 |
| JP | 2000223419 A | 8/2000 |
| JP | 2003193235 A | 7/2003 |
| JP | 2003209060 A | 7/2003 |
| JP | 200464042 A | 2/2004 |
| JP | 2004241482 A | 8/2004 |
| JP | 2005-179743 A | 7/2005 |
| JP | 2005317670 A | 11/2005 |
| JP | 2006176811 A | 7/2006 |
| JP | 200746135 A | 2/2007 |

OTHER PUBLICATIONS

Japanese Office Action for corresponding JP Application No. 2007-112333, Dec. 2, 2008, Japan.
Japanese Office Action for corresponding JP Application No. 2007-112333, Apr. 7, 2009, Japan.

(Continued)

*Primary Examiner* — Toniae Thomas
(74) *Attorney, Agent, or Firm* — Ditthavong Mori & Steiner, P.C.

(57) ABSTRACT

A method of manufacturing a semiconductor film capable of inhibiting the quality of a semiconductor film from destabilization is obtained. This method of manufacturing a semiconductor film includes steps of introducing source gas for a semiconductor, controlling the pressure of an atmosphere formed by the source gas to a prescribed level, heating a catalytic wire to at least a prescribed temperature after controlling the pressure of the atmosphere to the prescribed level and forming a semiconductor film by decomposing the source gas with the heated catalytic wire.

16 Claims, 2 Drawing Sheets

OTHER PUBLICATIONS

Extended European Search Report for corresponding EP Application No. 08251466.2-1235, dated Jun. 23, 2010, pp. 1-8.

Knoesen, et al., "Extension of the lifetime of tantalum filaments in the hot-wire (Cat) Chemical Vapor Deposition process", Thin Solid Films, vol. 516, No. 5 (2008) pp. 822-825.

Van Veen, et al. "Beneficial effect of a low deposition temperature of hot-wire deposited intrinsic amorphous silicon for solar cells", Journal of Applied Physics, vol. 93, No. 1, Jan. 1, 2003, pp. 1-5.

Chinese Office Action for corresponding CN Application No. 200810092632.7, dated Jan. 26, 2011, pp. 1-19, China.

* cited by examiner

METHOD OF MANUFACTURING SEMICONDUCTOR FILM AND METHOD OF MANUFACTURING PHOTOVOLTAIC ELEMENT

BACKGROUND OF THE INVENTION

1. Field of the Invention

The present invention relates to a method of manufacturing a semiconductor film and a method of manufacturing a photovoltaic element, and more particularly, it relates to a method of manufacturing a semiconductor film and a method of manufacturing a photovoltaic element each comprising a step of forming a semiconductor film by decomposing source gas with a catalytic wire.

2. Description of the Background Art

A method of manufacturing a semiconductor film comprising a step of forming a semiconductor film by decomposing source gas with a catalytic wire is known in general, as disclosed in Japanese Patent No. 3453214, for example.

According to the aforementioned Japanese Patent No. 3453214, a gas mixture of gas (source gas) of a silicon compound such as silane ($SiH_4$) and gas of another material such as hydrogen ($H_2$) is introduced into a catalytic body (catalytic wire) supplied with power to be heated to at least the thermal decomposition temperature of the source gas, thereby decomposing the silicon compound and forming a silicon film (semiconductor film) on the surface of a substrate.

However, the aforementioned Japanese Patent No. 3453214 discloses neither the timing for starting supplying power to (starting heating) the catalytic body (catalytic wire) nor the timing for introducing the source gas in formation of the silicon film (semiconductor film). In general, heating of the catalytic body is started and the source gas is introduced at the same time. In this case, a constant time is required for stabilizing the pressure of an atmosphere formed by the source gas after the introduction of the source gas, and hence the semiconductor film is formed in a state where the pressure of the atmosphere formed by the source gas is not yet stabilized in the initial state. In this case, the quality of the semiconductor film formed in the state where the pressure of the atmosphere formed by the source gas is not yet stabilized is disadvantageously destabilized.

SUMMARY OF THE INVENTION

The present invention has been proposed in order to solve the aforementioned problem, and an object of the present invention is to provide a method of manufacturing a semiconductor film and a method of manufacturing a photovoltaic element each capable of inhibiting the quality of a semiconductor film from destabilization.

A method of manufacturing a semiconductor film according to a first aspect of the present invention comprises steps of introducing source gas for a semiconductor, controlling the pressure of an atmosphere formed by the source gas to a prescribed level, heating a catalytic wire to at least a prescribed temperature after controlling the pressure of the atmosphere to the prescribed level and forming a semiconductor film by decomposing the source gas with the heated catalytic wire.

A method of manufacturing a photovoltaic element according to a second aspect of the present invention comprises steps of introducing source gas for a semiconductor, controlling the pressure of an atmosphere formed by the source gas to a prescribed level, heating a catalytic wire to at least a prescribed temperature after controlling the pressure of the atmosphere to the prescribed level and forming a semiconductor film functioning as a photoelectric conversion layer by decomposing the source gas with the heated catalytic wire.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

First, the structure of a catalytic wire CVD apparatus employed for manufacturing a semiconductor film according to a first embodiment of the present invention is described with reference to FIG. 1.

Figure 1:
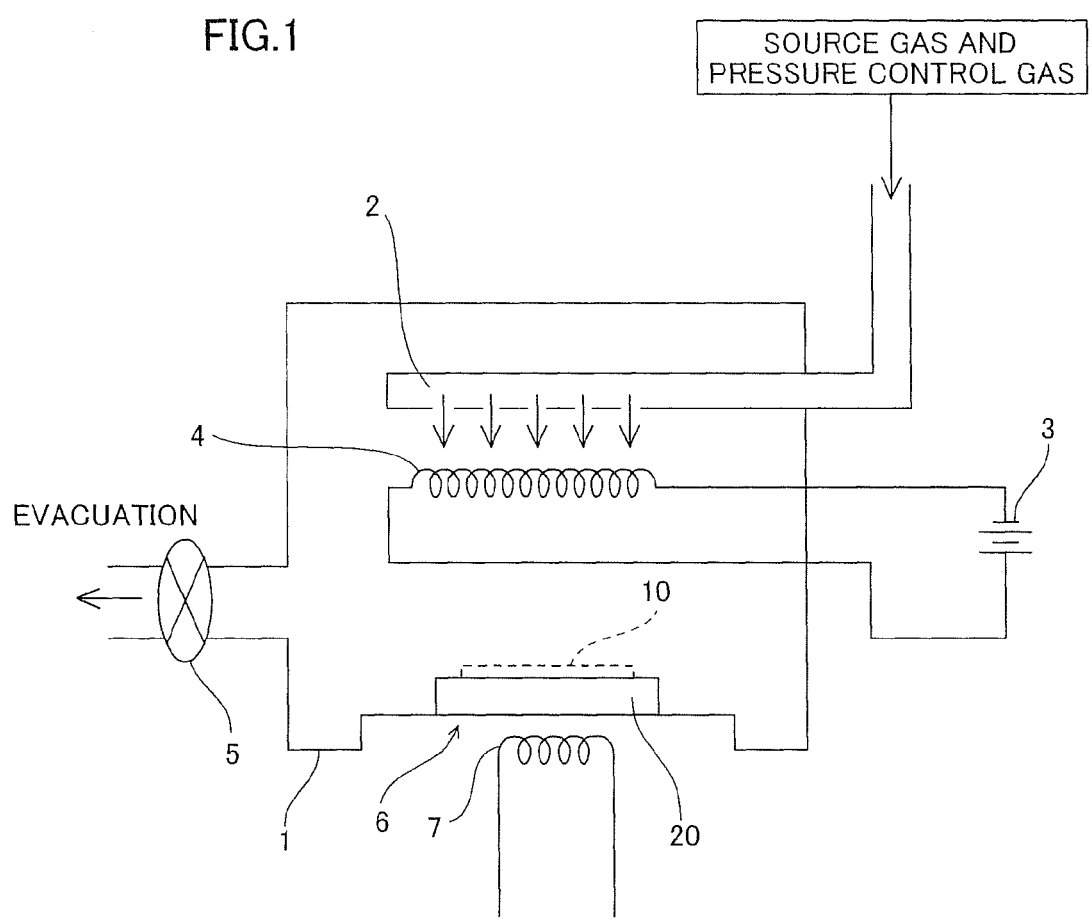
FIG. 1 is a schematic diagram of a catalytic wire CVD apparatus employed in the present invention.

As shown in FIG. 1, the catalytic wire CVD apparatus comprises a reaction chamber 1, a gas supply portion 2 for supplying source gas and pressure control gas into the reaction chamber 1, a catalytic wire 4 connected to a DC power source 3, an exhaust valve 5, a set portion 6 for setting an underlayer 20 for forming a semiconductor film 10 and a heater 7 for heating the underlayer 20 set on the set portion 6.

The catalytic wire 4 is made of tungsten (W). This catalytic wire 4 is heated by excitation with the DC power source 3. The reaction chamber 1 can be evacuated with a vacuum pump (not shown), and the exhaust valve 5 opens/closes an exhaust passage.

A method of manufacturing a semiconductor film according to the first embodiment of the present invention is described with reference to FIG. 1. According to the first embodiment, a hydrogenated amorphous silicon film is formed on the underlayer 20 as the semiconductor film 10. Table 1 shows exemplary conditions for manufacturing the amorphous silicon film.

TABLE 1

| | |
|---|---|
| Material for Catalytic Wire | Tungsten |
| Diameter of Catalytic Wire | 0.5 mm |
| Temperature of Catalytic Wire | 1700° C. |
| Temperature of Underlayer | 200° C. |
| Pressure | 3 Pa |
| Flow Rate of $SiH_4$ | 500 sccm |
| Flow Rate of $H_2$ | 1000 sccm |

As shown in Table 1, the catalytic wire 4 of tungsten having a diameter of about 0.5 mm is employed for forming the amorphous silicon film. The underlayer 20 is set on the set portion 6 of the catalytic wire CVD apparatus provided with this catalytic wire 4. The underlayer 20 is formed by an amorphous silicon film, a transparent conductive oxide film or a single-crystalline silicon substrate, for example. Formation of the amorphous silicon film is started in this state. Table 2 shows manufacturing process conditions for the amorphous silicon film according to the first embodiment.

TABLE 2

| | Step | Introduction of Source Gas | Pressure Control | Heating of Catalytic Wire | Film Formation | Evacuation | End |
|---|---|---|---|---|---|---|---|
| Embodiment | Catalytic Wire | | | ON | ON | ON | OFF |
| | Source Gas | ON | ON | ON | ON | OFF | |

In order to form the amorphous silicon film by the method of manufacturing a semiconductor film according to the first embodiment, the underlayer 20 is heated to about 200° C. with the heater 7 as shown in Table 1, and the source gas of $SiH_4$ for forming the amorphous silicon film (semiconductor film 10) is introduced into the reaction chamber 1 from the gas supply portion 2, as shown in Table 2. The source gas of $SiH_4$ is diluted with non-source gas of $H_2$. As shown in Table 1, $SiH_4$ and $H_2$ are introduced at flow rates of about 500 sccm and about 1000 sccm respectively. Thereafter the pressure of the source gas is controlled according to the present invention. In other words, the pressure of the source gas is controlled to about 3 Pa (with partial pressures of about 1 Pa and about 2 Pa of $SiH_4$ and $H_2$ respectively), as shown in Table 1. Thereafter the catalytic wire 4 is heated to about 1700° C. by excitation with the DC power source 3, as shown in Table 2.

The catalytic wire 4 heated to about 1700° C. and the source gas of $SiH_4$ present in the reaction chamber 1 come into contact with each other. Thus, the catalytic wire 4 heated to about 1700° C. decomposes $SiH_4$, and the decomposed species is deposited on the underlayer 20, for forming the hydrogenated amorphous silicon film (semiconductor film 10) on the underlayer 20.

After the formation of the hydrogenated amorphous silicon film, the exhaust valve 5 is opened for evacuating the reaction chamber 1 with the vacuum pump (not shown), as shown in Table 2. After the source gas ($SiH_4$) is substantially exhausted from the reaction chamber 1, the DC power source 3 stops exciting the catalytic wire 4. Thus, the temperature of the catalytic wire 4 is reduced in the state where the source gas is substantially exhausted from the reaction chamber 1. The amorphous silicon film (semiconductor film 10) according to the first embodiment is formed in this manner.

According to the first embodiment, as hereinabove described, formation of the semiconductor film 10 can be started in the state where the pressure of the atmosphere is stable by controlling the pressure of the atmosphere to about 3 Pa, thereafter heating the catalytic wire 4 to about 1700° C. and decomposing the source gas of $SiH_4$ with the heated catalytic wire 4 thereby forming the semiconductor film 10, whereby formation of the semiconductor film 10 in a state where the pressure of the atmosphere is instable can be suppressed. Thus, the quality of the semiconductor film 10 can be inhibited from destabilization.

The source gas of $SiH_4$ is diluted with the non-source gas of $H_2$, whereby the partial pressure of the source gas can be reduced to about 1 Pa when controlling the pressure of the atmosphere to about 3 Pa (total pressure of the source gas and the non-source gas). Thus, the pressure in the reaction chamber 1 can be controlled to about 3 Pa with a smaller quantity of the source gas as compared with a case of not diluting the source gas with the non-source gas. If heating of the catalytic wire 4 is started in a state introducing the source gas of $SiH_4$ into the reaction chamber 1, a constant time is required for heating the catalytic wire 4 to about 1700° C., and hence the catalytic wire 4 at a temperature of less than about 1700° C. and the source gas of $SiH_4$ come into contact with each other immediately after heating of the catalytic wire 4 is started. At this time, the source gas of $SiH_4$ easily remains on the insufficiently heated catalytic wire 4 (at the temperature of less than about 1700° C.), and hence a compound (tungsten silicide) of the catalytic wire 4 of tungsten (W) and the source gas of $SiH_4$ may be formed on the surface of the catalytic wire 4. According to the first embodiment, however, the pressure in the reaction chamber 1 is controlled to about 3 Pa with a relatively small quantity of the source gas of $SiH_4$, whereby the surface of the catalytic wire 4 can be prevented from formation of a silicide due to the small quantity of $SiH_4$. Thus, the resistivity of the catalytic wire 4 can be inhibited from variation resulting from formation of this compound, whereby difficulty in temperature control of the catalytic wire 4 can be suppressed.

According to the first embodiment, as hereinabove described, the source gas is exhausted from the reaction chamber 1 after the formation of the semiconductor film 10 and heating of the catalytic wire 4 heated to about 1700° C. is stopped after the source gas ($SiH_4$) is substantially exhausted from the reaction chamber 1, whereby the catalytic wire 4 and $SiH_4$ can be prevented from coming into contact with each other in a state where the temperature of the catalytic wire 4 is lower than about 1700° C. At the end of the manufacturing process for the amorphous silicon film (semiconductor film 10), therefore, formation of a compound (tungsten silicide) of the catalytic wire 4 made of tungsten (W) and the source gas of $SiH_4$ can be suppressed. Therefore, difficulty in temperature control of the catalytic wire 4 can be suppressed similarly to the above.

Second Embodiment

According to a second embodiment of the present invention, a thin-film photovoltaic element 100 is manufactured by the method of manufacturing a semiconductor film according to the aforementioned first embodiment. First, the structure of the thin-film photovoltaic element 100 manufactured by the method of manufacturing a semiconductor film according to the present invention is described with reference to FIG. 2.

Figure 2:
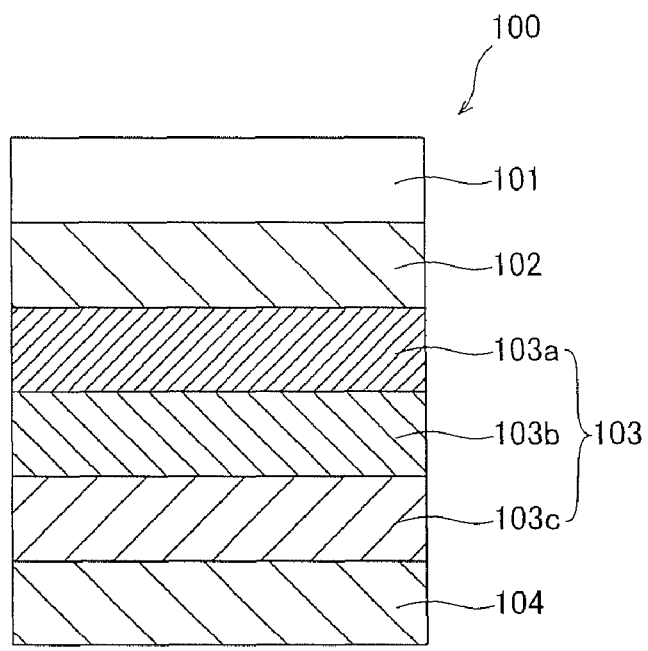
FIG. 2 is a sectional view of a thin-film photovoltaic element manufactured according to the present invention.

As shown in FIG. 2, the photovoltaic element 100 comprises a substrate 101, a surface electrode layer 102, a photoelectric conversion layer 103 and a rear electrode layer 104.

The substrate 101 has an insulating surface, and is made of glass having transparency. The surface electrode layer 102 is formed on the upper surface of the substrate 101. This surface electrode layer 102 is formed by a TCO (transparent conductive oxide) film of tin oxide ($SnO_2$) or the like having conductivity and transparency.

The photoelectric conversion layer 103 made of a p-i-n-type amorphous silicon-based semiconductor is formed on the upper surface of the surface electrode layer 102. This photoelectric conversion layer 103 of the p-i-n-type amorphous silicon-based semiconductor is constituted of a p-type hydrogenated amorphous silicon carbide (a-SiC:H) layer 103a (hereinafter referred to as a p layer 103a), an i-type hydrogenated amorphous silicon (a-Si:H) layer 103b (hereinafter referred to as an i layer 103b) and an n-type hydrogenated amorphous silicon (a-Si:H) layer 103c (hereinafter referred to as an n layer 103c).

The rear electrode layer 104 is formed on the upper surface of the photoelectric conversion layer 103. The rear electrode layer 104 is formed by holding the front and back surfaces of a silver (Ag) layer with a pair of ZnO layers.

A manufacturing process for the photovoltaic element 100 shown in FIG. 2 is now described. In the manufacturing process for the photovoltaic element 100, the surface electrode layer 102 of tin oxide is first formed on the upper surface of the substrate 101 having the insulating surface by thermal CVD (chemical vapor deposition).

Then, the p layer (p-type hydrogenated amorphous silicon carbide layer) 103a, the i layer (i-type hydrogenated amorphous silicon layer) 103b and the n layer (n-type hydrogenated amorphous silicon layer) 103c are successively formed on the upper surface of the surface electrode layer 102 by catalytic wire CVD, thereby forming the photoelectric conversion layer 103 of the amorphous silicon-based semiconductor. At this time, source gas diluted with hydrogen ($H_2$) is introduced, the pressure of the atmosphere formed by the source gas is controlled and thereafter a catalytic wire 4 (see FIG. 1) is heated similarly to the aforementioned first embodiment, for forming the p layer (p-type hydrogenated amorphous silicon carbide layer) 103a on the surface electrode layer 102 consisting of the transparent conductive oxide film, forming the i layer 103b on the p layer 103a and forming the n layer 103c on the i layer 103b respectively.

Thereafter the rear electrode layer 104 consisting of the metallic material layers (the ZnO layer (upper layer), the Ag layer (intermediate layer) and the ZnO layer (lower layer)) mainly composed of silver is formed on the upper surface of the photoelectric conversion layer 103 (n layer 103c) by sputtering. The thin-film photovoltaic element 100 is manufactured in this manner.

According to the second embodiment, as hereinabove described, the thin-film photovoltaic element 100 is manufactured by forming the photoelectric conversion layer 103 by the method of manufacturing a semiconductor film according to the aforementioned first embodiment, whereby the quality of the photoelectric conversion layer 103 can be inhibited from destabilization. Thus, the thin-film photovoltaic element 100 can be manufactured with stable performance.

Third Embodiment

According to a third embodiment of the present invention, a heterojunction photovoltaic element 200 is manufactured by the method of manufacturing a semiconductor film according to the aforementioned first embodiment. First, the structure of the heterojunction photovoltaic element 200 manufactured by the method of manufacturing a semiconductor film according to the present invention is described with reference to FIG. 3.

Figure 3:
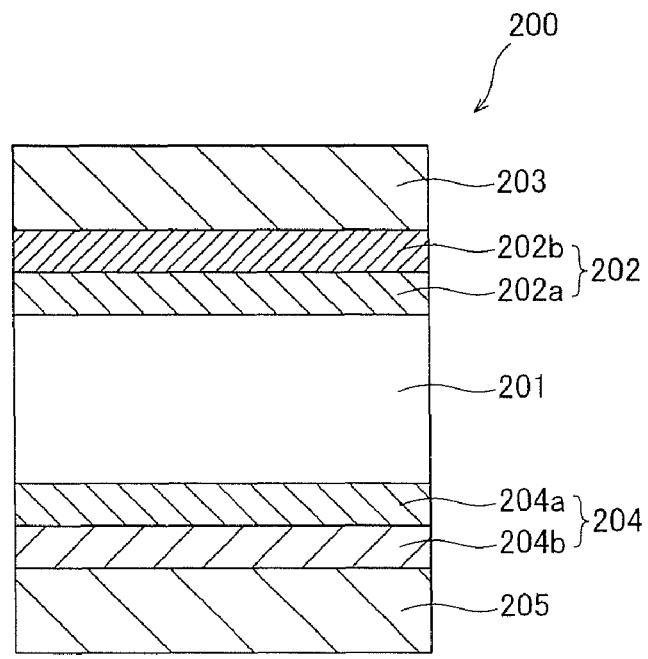
FIG. 3 is a sectional view showing a heterojunction photovoltaic element manufactured according to the present invention.

In the photovoltaic element 200 according to the third embodiment, an amorphous silicon (a-Si) layer 202 functioning as a photoelectric conversion layer and a surface electrode layer 203 are successively formed on the upper surface of an n-type single-crystalline silicon (c-Si) substrate 201, as shown in FIG. 3. The surface electrode layer 203 is formed by a transparent conductive oxide film of ITO (indium tin oxide). The amorphous silicon layer 202 is constituted of a substantially intrinsic i-type amorphous silicon layer 202a formed on the upper surface of the n-type single-crystalline silicon substrate 201 and a p-type amorphous silicon layer 202b doped with boron (B) formed on the i-type amorphous silicon layer 202a. The i-type amorphous silicon layer 202a has a small thickness, in order not to substantially contribute to power generation as an optical active layer.

An amorphous silicon layer 204 functioning as a photoelectric conversion layer and a rear electrode layer 205 are formed on the back surface of the n-type single-crystalline silicon substrate 201 successively from the side closer to the back surface of the n-type single-crystalline silicon substrate 201. The rear electrode layer 205 is formed by a transparent conductive oxide film of ITO. The amorphous silicon layer 204 is constituted of a substantially intrinsic i-type amorphous silicon layer 204a formed on the back surface of the n-type single-crystalline silicon substrate 201 and an n-type amorphous silicon layer 204b doped with phosphorus (P) formed on the back surface of the i-type amorphous silicon layer 204a. The i-type amorphous silicon layer 204a has a small thickness, in order not to substantially contribute to power generation. The i-type amorphous silicon layer 204a, the n-type amorphous silicon layer 204b and the rear electrode layer 205 constitute the so-called BSF (back surface field) structure.

A manufacturing process for the photovoltaic element 200 is now described with reference to FIG. 3.

First, the n-type single-crystalline silicon substrate 201 is cleaned and set in a vacuum chamber (not shown) and thereafter heated under a temperature condition of not more than 200° C., for removing moisture adhering to the surface of the n-type single-crystalline silicon substrate 201 to the utmost. Thus, oxygen contained in the moisture adhering to the surface of the n-type single-crystalline silicon substrate 201 is inhibited from binding to silicon and forming defects.

Then, hydrogen ($H_2$) gas is introduced while keeping the substrate temperature at 170° C., for hydrogenating the upper surface of the n-type single-crystalline silicon substrate 201. Thus, the upper surface of the n-type single-crystalline silicon substrate 201 is cleaned, and hydrogen atoms are adsorbed around the upper surface of the n-type single-crystalline silicon substrate 201. The adsorbed hydrogen atoms inactivate (terminate) defects on the upper surface of the n-type single-crystalline silicon substrate 201.

Thereafter the respective layers are formed on the front and back surfaces of the n-type single-crystalline silicon substrate 201.

More specifically, the i-type amorphous silicon layer 202a is formed on the upper surface of the n-type single-crystalline silicon substrate 201 by catalytic wire CVD. At this time, the i-type amorphous silicon layer 202a is formed by introducing source gas diluted with hydrogen ($H_2$), controlling the pressure of the atmosphere formed by the source gas and thereafter heating a catalytic wire 4 (see FIG. 1), similarly to the aforementioned first embodiment.

Then, the p-type amorphous silicon layer 202b doped with boron (B) is formed on the i-type amorphous silicon layer 202a by catalytic wire CVD. At this time, the p-type amorphous silicon layer 202b is formed by introducing the source gas diluted with hydrogen ($H_2$), controlling the pressure of the atmosphere formed by the source gas and thereafter heating the catalytic wire 4 (see FIG. 1), similarly to the aforementioned first embodiment.

Then, the surface electrode layer 203 of ITO (indium tin oxide) is formed on the upper surface of the p-type amorphous silicon layer 202b by sputtering.

Then, the i-type amorphous silicon layer 204a is formed on the back surface of the n-type single-crystalline silicon substrate 201 by catalytic wire CVD. At this time, the i-type amorphous silicon layer 204a is formed by introducing the source gas diluted with hydrogen ($H_2$), controlling the pressure of the atmosphere formed by the source gas and thereafter heating the catalytic wire 4 (see FIG. 1), similarly to the aforementioned first embodiment.

Then, the n-type amorphous silicon layer 204b doped with phosphorus (P) is formed on the back surface of the i-type amorphous silicon layer 204a by catalytic wire CVD. At this time, the n-type amorphous silicon layer 204b is formed by introducing source gas diluted with hydrogen ($H_2$), controlling the pressure of the atmosphere formed by the source gas and thereafter heating the catalytic wire 4 (see FIG. 1), similarly to the aforementioned first embodiment.

Finally, the rear electrode layer 205 of ITO is formed on the back surface of the n-type amorphous silicon layer 204b by sputtering. The heterojunction photovoltaic element 200 shown in FIG. 3 is formed in this manner.

According to the third embodiment, as hereinabove described, the heterojunction photovoltaic element 200 is manufactured by the method of manufacturing a semiconductor film according to the aforementioned first embodiment, whereby the qualities of the amorphous silicon layers 202 and 204 can be inhibited from destabilization when the heterojunction photovoltaic element 200 is manufactured by catalytic wire CVD. Thus, the heterojunction photovoltaic element 200 can be manufactured with stable performance, similarly to the aforementioned second embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while silane ($SiH_4$) gas is employed as the source gas in the aforementioned first embodiment, the present invention is not restricted to this but another silane-based gas such as disilane ($Si_2H_6$) or trisilane ($Si_3H_8$) may alternatively be employed, or silicon fluoride-based gas such as $SiF_2$ or $SiH_2F_2$ may be employed.

While the catalytic wire 4 is made of tungsten (W) in the aforementioned first embodiment, the present invention is not restricted to this but a catalytic wire made of another high-melting point material such as tantalum (Ta) may alternatively be employed. When the catalytic wire made of tantalum is employed, the surface of the catalytic wire can be more inhibited from formation of a silicide as compared with the case of employing the catalytic wire 4 made of tungsten.

While the amorphous silicon film is formed on the underlayer 20 as the semiconductor film 10 under the film forming conditions shown in Table 1 in the aforementioned first embodiment, the present invention is not restricted to this but a semiconductor film of microcrystalline silicon or polycrystalline silicon may alternatively be formed on the underlayer 20 as the semiconductor film 10 by changing the film forming conditions.

While hydrogen ($H_2$) gas is employed as the non-source gas diluting the source gas in the aforementioned first embodiment, the present invention is not restricted to this but rare gas such as argon (Ar) gas, fluorine ($F_2$) gas, chlorine ($Cl_2$) gas, nitrogen ($N_2$) gas, carbon dioxide ($CO_2$) gas or methane ($CH_4$) gas may alternatively be employed as the non-source gas.

While the pressure of the atmosphere is controlled to about 3 Pa in total with the partial pressures of about 1 Pa and about 2 Pa of the source gas and the non-source gas in the aforementioned first embodiment, the present invention is not restricted to this but the pressure of the atmosphere may not be controlled to about 3 Pa. The partial pressure of the source gas is preferably set to not more than about 1 Pa.

While the reaction chamber 1 is evacuated with the vacuum pump in the aforementioned first embodiment, the present invention is not restricted to this but the reaction chamber 1 may alternatively be evacuated with supply of gas ($H_2$ gas or Ar gas) containing no film forming species such as $SiH_4$. Thus, the speed for exhausting $SiH_4$ from the reaction chamber 1 can be increased. After film formation, the source gas ($SiH_4$) may simply be exhausted, while the remaining gas ($H_2$ gas or the like) may remain in the reaction chamber 1. When $H_2$ gas remains in the reaction chamber 1, a compound (silicide) formed on the surface of the catalytic wire 4 can be removed by etching.

While the thin-film photovoltaic element 100 and the heterojunction photovoltaic element 200 are manufactured in the aforementioned second and third embodiments respectively, the present invention is not restricted to these but is generally applicable to a photoelectric element having a semiconductor film manufactured by catalytic wire CVD. Further, the present invention is not restricted to the photovoltaic element but is generally applicable to a semiconductor element having a semiconductor film manufactured by catalytic wire CVD.

What is claimed is:

1. A method of manufacturing a semiconductor film comprising steps of:
   introducing source gas for a semiconductor;
   controlling the pressure of an atmosphere formed by said source gas to a prescribed level;
   heating a catalytic wire to at least a prescribed temperature after controlling the pressure of said atmosphere to said prescribed level;
   forming a semiconductor film by decomposing said source gas with heated said catalytic wire;
   exhausting said source gas while maintaining a heated state of said catalytic wire to at least said prescribed temperature after forming said semiconductor film, and
   stopping heating said catalytic wire heated to at least said prescribed temperature after substantially exhausting said source gas.

2. The method of manufacturing a semiconductor film according to claim 1, wherein
   said source gas is diluted with non-source gas.

3. The method of manufacturing a semiconductor film according to claim 2, wherein
   said source gas includes silane-based gas, and
   said non-source gas includes hydrogen gas.

4. The method of manufacturing a semiconductor film according to claim 1, wherein
   said semiconductor film includes an amorphous silicon film.

5. The method of manufacturing a semiconductor film according to claim 1, wherein
   said source gas includes silane gas, and
   said prescribed temperature is at least 1700° C.

6. The method of manufacturing a semiconductor film according to claim 1, wherein
   said catalytic wire is made of tungsten.

7. The method of manufacturing a semiconductor film according to claim 1, wherein said step of forming said semiconductor film includes a step of depositing said decomposed source gas on an underlayer thereby forming said semiconductor film on said underlayer.

8. The method of manufacturing a semiconductor film according to claim 7, wherein
said underlayer includes an amorphous silicon film, a transparent conductive oxide film or a single-crystalline silicon substrate.

9. A method of manufacturing a photovoltaic element comprising steps of:
introducing source gas for a semiconductor;
controlling the pressure of an atmosphere formed by said source gas to a prescribed level;
heating a catalytic wire to at least a prescribed temperature after controlling the pressure of said atmosphere to said prescribed level;
forming a semiconductor film functioning as a photoelectric conversion layer by decomposing said source gas with heated said catalytic wire;
exhausting said source gas while maintaining a heated state of said catalytic wire to at least said prescribed temperature after forming said semiconductor film, and
stopping heating said catalytic wire heated to at least said prescribed temperature after substantially exhausting said source gas.

10. The method of manufacturing a photovoltaic element according to claim 9, wherein
said source gas is diluted with non-source gas.

11. The method of manufacturing a photovoltaic element according to claim 10, wherein
said source gas includes silane-based gas, and
said non-source gas includes hydrogen gas.

12. The method of manufacturing a photovoltaic element according to claim 9, wherein
said semiconductor film includes an amorphous silicon film.

13. The method of manufacturing a photovoltaic element according to claim 9, wherein
said source gas includes silane gas, and
said prescribed temperature is at least 1700° C.

14. The method of manufacturing a photovoltaic element according to claim 9, wherein
said catalytic wire is made of tungsten.

15. The method of manufacturing a photovoltaic element according to claim 9, wherein
said step of forming said semiconductor film includes a step of depositing said decomposed source gas on an underlayer thereby forming said semiconductor film on said underlayer.

16. The method of manufacturing a photovoltaic element according to claim 15, wherein
said underlayer includes an amorphous silicon film, a transparent conductive oxide film or a single-crystalline silicon substrate.

* * * * *